United States Patent
Chao et al.

(10) Patent No.: US 8,537,937 B2
(45) Date of Patent: Sep. 17, 2013

(54) DETECTING CIRCUIT AND RELATED DETECTING METHOD

(75) Inventors: Kuan-Hua Chao, Taipei (TW); Tzu-Li Hung, Kaohsiung (TW); Yu-Bang Nian, Changhua County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 335 days.

(21) Appl. No.: 12/987,146

(22) Filed: Jan. 9, 2011

(65) Prior Publication Data
US 2012/0177146 A1 Jul. 12, 2012

(51) Int. Cl.
*H03D 1/00* (2006.01)
*H04L 27/06* (2006.01)

(52) U.S. Cl.
USPC ........... 375/340; 375/316; 375/318; 375/259; 375/219; 375/257; 370/241; 370/242

(58) Field of Classification Search
USPC ............... 375/340, 316, 351, 318, 259, 219, 375/257; 370/241, 242
See application file for complete search history.

(56) References Cited

U.S. PATENT DOCUMENTS

| 5,436,934 A | * | 7/1995 | Co | 375/351 |
| 2010/0164853 A1 | * | 7/2010 | Kim | 345/99 |

* cited by examiner

*Primary Examiner* — Phuong Phu
(74) *Attorney, Agent, or Firm* — Winston Hsu; Scott Margo

(57) ABSTRACT

A detecting circuit includes: a first offset generating circuit arranged to apply a first offset to an input signal pair comprising a positive input signal and a negative input signal and accordingly generate a first output signal pair comprising a first positive output signal and a first negative output signal; and a first sampling circuit coupled to the first offset generating circuit, the first sampling circuit arranged to sample a difference in voltage between the first positive output signal and the first negative output signal to generate a first sampling signal, wherein the first sampling signal is utilized to identify a data signal on the input signal pair.

21 Claims, 7 Drawing Sheets

DETECTING CIRCUIT AND RELATED DETECTING METHOD

BACKGROUND

The present invention relates to detecting circuit and a related detecting method, and more particularly to a detecting circuit applied for generating a detection signal according to an input signal pair to notify a receiving system, and a detecting method thereof.

In a signal transmission system, a receiver of the signal transmission system is set to go into a sleep mode when the receiver does not receive any signal for a certain period of time, in order to reduce the current consumption of the receiver. However, the receiver should awake as soon as possible when a real signal (e.g. data signal) is transmitted to the receiver such that the receiver does not miss the inputted signal. Therefore, a signal detection circuit is installed in front of the receiver to detect if the real signal is inputted into the receiver when the receiver is in the sleep mode. When the signal detection circuit detects that the real signal has appeared on the cable connected to the receiver, the signal detection circuit awakes the receiver from the sleep mode. Then, a clock data recovery circuit in the receiver starts to lock the inputted signal. In certain advanced signal transmission systems, such as a high speed serial link system, the frequency of the inputted signal has become much faster in order to increase the data transmission rate of the system. Under this circumstance, the conventional signal detection circuit may be too slow in detecting the high speed inputted signal. More specifically, the signal detection circuit may be unable to determine if the inputted signal is the real signal or just noise that has emerged from the cable. If the signal detection circuit does not precisely awake the receiver when the real signal is transmitted to the receiver, the receiver may miss the inputted signal. To solve this problem, complex signal detection circuits using analog peak-bottom holders are developed. Under high operation speed requirement, however, the signal detection circuits are power-consumed with large level variation. That is, conventional signal detection circuits cannot look after both accuracy and simplicity. Therefore, providing an efficient and high speed signal detection circuit to precisely detect the real input signal is a significant concern in the field of signal transmission systems.

SUMMARY

One of the objectives of the present invention is therefore to provide a detecting circuit applied for generating a detection signal according to an input signal pair to notify a receiving system, and a related detecting method.

According to a first embodiment of the present invention, a detecting circuit is disclosed. The detecting circuit comprises a first offset generating circuit and a first sampling circuit. The first offset generating circuit is arranged to apply a first offset to an input signal pair comprising a positive input signal and a negative input signal and accordingly generate a first output signal pair comprising a first positive output signal and a first negative output signal. The first sampling circuit is coupled to the first offset generating circuit, and is arranged to sample a difference in voltage between the first positive output signal and the first negative output signal to generate a first sampling signal, wherein the first sampling signal is utilized to identify a data signal on the input signal pair.

According to a second embodiment of the present invention, a detecting method is disclosed. The detecting method comprises: applying a first offset to an input signal pair comprising a positive input signal and a negative input signal to accordingly generate a first output signal pair comprising a first positive output signal and a first negative output signal; and sampling a difference in voltage between the first positive output signal and the first negative output signal to generate a first sampling signal, wherein the first sampling signal is utilized to identify a data signal on the input signal pair.

According to a third embodiment of the present invention, a detecting method is disclosed. The detecting method comprises: applying an offset to an input signal pair to accordingly generate an offset output signal pair, and sampling the offset output signal pair for generating a sampling signal when a difference in voltage between the first offset output signal pair reaches a predetermined level, wherein the sampling signal is utilized to identify a data signal on the input signal pair.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
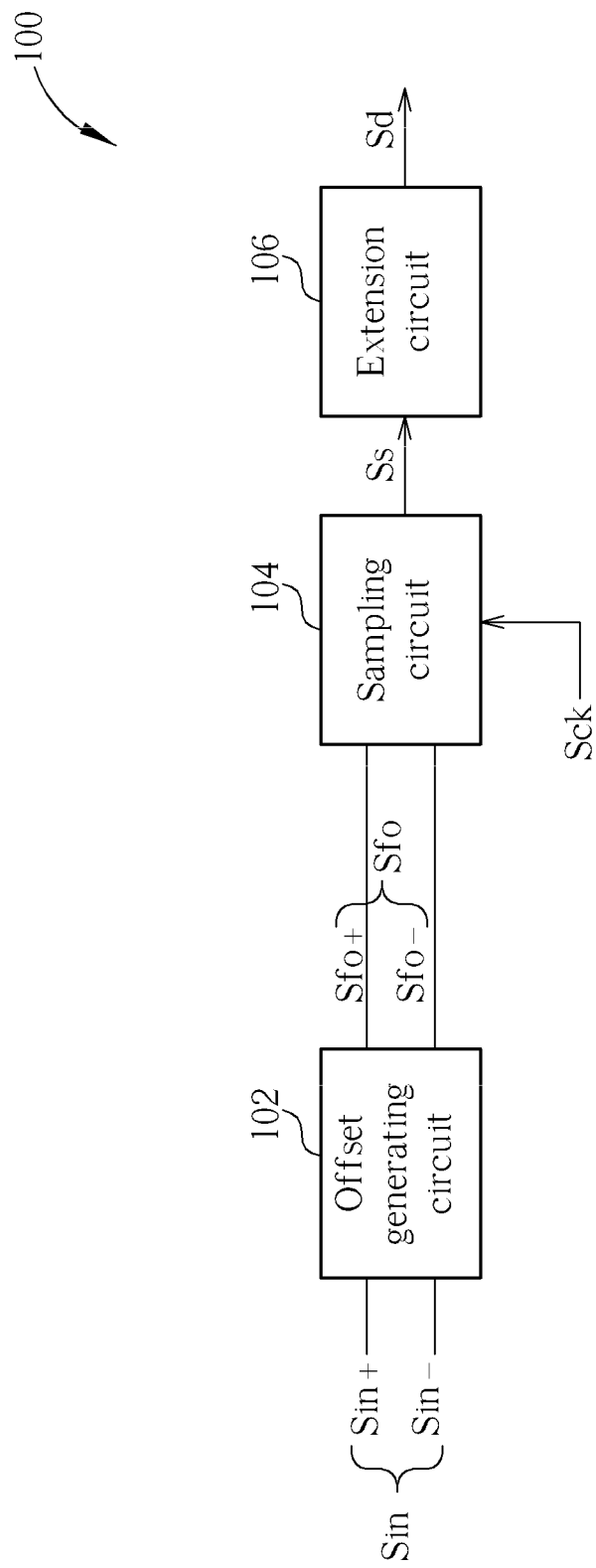
FIG. 1 is a diagram illustrating a detecting circuit according to an embodiment of the present invention.

Please refer to FIG. 1. FIG. 1 is a diagram illustrating a detecting circuit 100 according to an embodiment of the present invention. The detecting circuit 100 is employed for generating a detection signal Sd according to an input signal pair Sin, wherein the detection signal Sd is suitable for identifying whether a data signal is received on the input signal pair. In other words, the obtained detection signal Sd is utilized to identify if a real signal is transmitted to a receiver. The detecting circuit 100 comprises an offset generating circuit 102, a sampling circuit 104, and an extension circuit 106. The offset generating circuit 102 is arranged to apply an offset, e.g., an offset voltage Vf, to the input signal pair Sin and accordingly generate an offset output signal pair Sfo. The sampling circuit 104 is coupled to the offset generating circuit 102, and the sampling circuit 104 is arranged to sample the offset output signal pair Sfo for generating a sampling signal Ss when a different voltage between the offset output signal pair Sfo reaches a predetermined level Vp according to a clock signal Sck. The extension circuit 106 is coupled to the sampling circuit 104 and is arranged to generate the detection signal Sd according to at least the sampling signal Ss. The sampling signal Ss has transitions between a first signal level V1 (e.g. low logic level '0') and a second signal level V2 (e.g. high logic level '1'), and the extension circuit 106 is utilized for removing or smoothing the toggle of the sampling signal Ss. In one embodiment, the extension circuit 106 is arranged to hold the second signal level V2 of the sampling signal Ss during at least one specific duration and accordingly generate the detection signal Sd. However, if the toggle issue is prevented, for example, the sampling signal Ss is without toggle or the subsequent circuit that receives the detection signal Sd is compatible with the toggle of the sampling signal Ss, the extension circuit 106 may be omitted.

More specifically, according to the present embodiment, the input signal pair Sin is a differential input signal pair; therefore the input signal pair Sin includes a positive input signal and a negative input signal, i.e., a first input signal Sin+ and a second input signal Sin− respectively. Accordingly, the offset output signal pair Sfo is also a differential output signal pair including a first positive output signal and a first negative output signal, i.e., a first output signal Sfo+ and a second output signal Sfo− respectively. The offset generating circuit 102 provides the offset voltage Vf to the input signal pair Sin in order to provide different common mode voltages to the first output signal Sfo+ and the second output signal Sfo−. In one embodiment, the common mode voltage of the first input signal Sin+ is reduced to accordingly generate the first output signal Sfo+, while the common mode voltage of the second input signal Sin− is kept intact to accordingly generate the second output signal Sfo−, i.e., the common mode voltage of the first output signal Sfo+ is lower than the common mode voltage of the first input signal Sin+, and the common mode voltage of the second output signal Sfo− is equal to the common mode voltage of the second input signal Sin−. Therefore, the common mode voltage of the first output signal Sfo+ is the common mode voltage of the second output signal Sfo− minus the offset voltage Vf. It should be noted that the present invention is not meant to limit reducing the common mode voltage of the first input signal Sin+ while keeping the common mode voltage of the second input signal Sin− intact. Those skilled in the art will understand that reducing the common mode voltage of the second input signal Sin− and keep the common mode voltage of the first input signal Sin+ intact, or reducing/increasing the common mode voltage of the first input signal Sin+ while increasing/reducing the common mode voltage of the second input signal Sin− may also have a similar effect. These modifications also belong to the scope of the present invention.

Figure 2:
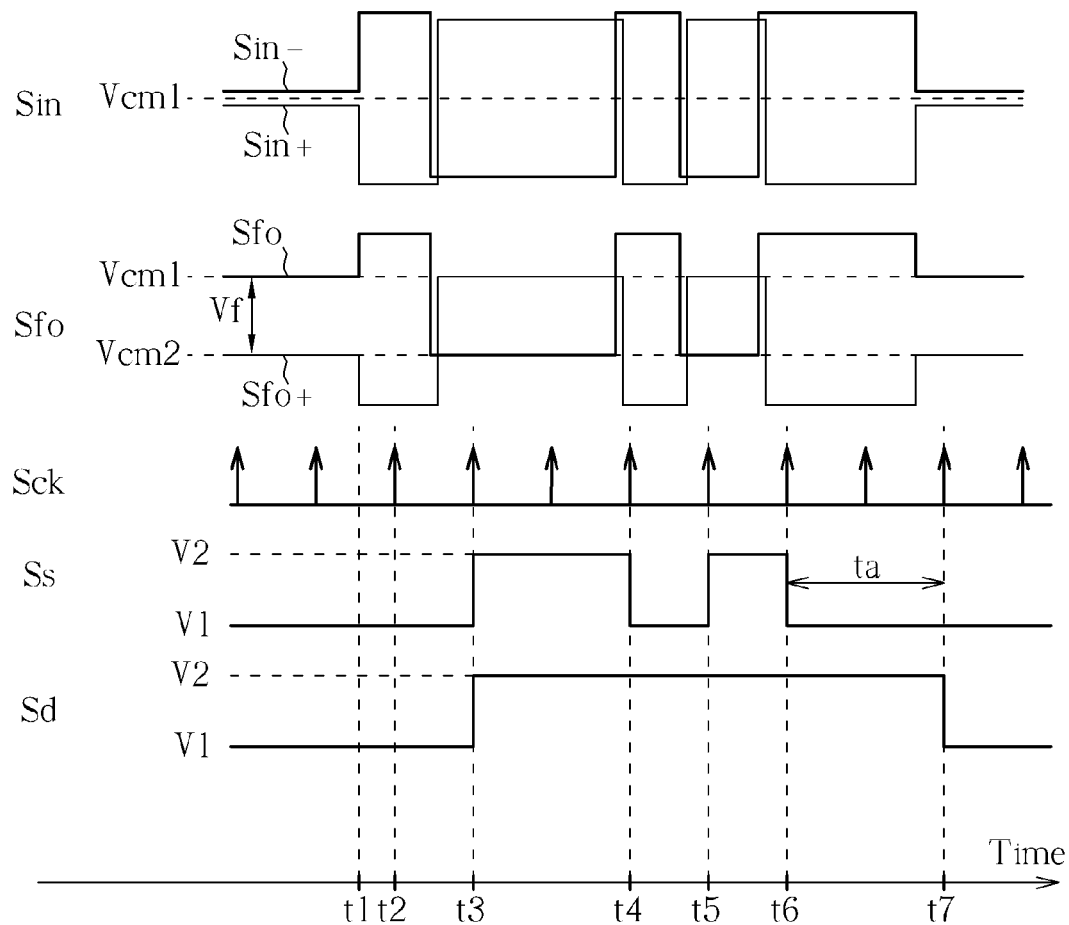
FIG. 2 is a timing diagram illustrating an input signal pair, an offset output signal pair, a clock signal, a sampling signal, and a detection signal in the detecting circuit shown in FIG. 1.

Please refer to FIG. 2. FIG. 2 is a timing diagram illustrating the input signal pair Sin, the output signal pair Sfo, the clock signal Sck, the sampling signal Ss, and the detection signal Sd according to an embodiment of the present invention, in which: the first input signal Sin+ and the second input signal Sin− have the same first common mode voltage Vcm1; the common mode voltage of the first output signal Sfo+ becomes the second common mode voltage Vcm2 but the common mode voltage of the second output signal Sfo− is still the first common mode voltage Vcm1 after being processed by the offset generating circuit 102; and the clock signal Sck is illustrated by a plurality of arrows as shown in FIG. 2. Furthermore, no real input data exists in the input signal pair Sin before the time t1, therefore the voltage levels of the first input signal Sin+ and the second input signal Sin− are kept at the first common mode voltage Vcm1 before the time t1. In other words, the difference in voltage between the first input signal Sin+ and the second input signal Sin−, i.e., the voltage level of the first input signal Sin+ minus the voltage level of the second input signal Sin−, is substantially equal to zero. When the real input data is inputted into the offset generating circuit 102 after the time t1, the difference in voltage between the first input signal Sin+ and the second input signal Sin− is larger than zero if the input data is bit one (e.g., the input data at time t3), and the difference in voltage between the first input signal Sin+ and the second input signal Sin− is smaller than zero if the input data is bit zero (e.g., the input data at time t2).

When the offset generating circuit 102 is employed to provide the offset voltage Vf upon the input signal pair Sin to generate the offset output signal pair Sfo, the difference in voltage between the first output signal Sfo+ and the second output signal Sfo−, i.e., the voltage level of the first output signal Sfo+ minus the voltage level of the second output signal Sfo−, is smaller than zero before the time t1. When the real input data is inputted into the offset generating circuit 102 after the time t1, the difference in voltage between the first output signal Sfo+ and the second output signal Sfo− is larger than zero if the input data is bit one (e.g., the input data at time t3), and the difference in voltage between the first output signal Sfo+ and the second output signal Sfo− is smaller than zero if the input data is bit zero (e.g., the input data at time t2). In other words, except for the case when the input data is bit one (when the input signal has an amplitude larger than the offset voltage Vf), the difference in voltage between the first output signal Sfo+ and the second output signal Sfo− is always smaller than zero. Then, by utilizing the clock signal Sck, the sampling circuit 104 samples the offset output signal pair Sfo to generate the sampling signal Ss indicating if the difference in voltage between the first output signal Sfo+ and the second output signal Sfo− is larger than zero as shown in FIG. 2.

Therefore, with employing the offset generating circuit 102 to process the input signal pair Sin before it is inputted into the sampling circuit 104, the sampling signal Ss is equivalent to indicate whether the difference in voltage between the first input signal Sin+ and the second input signal Sin− is larger than the offset voltage Vf or whether the amplitude of the input signal pair Sin is larger than the offset voltage Vf. In other words, when the voltage level of the first output signal Sfo+ is increased to reach the voltage level of the second output signal Sfo−, the difference in voltage between the first output signal Sfo+ and the second output signal Sfo− is larger than zero. Therefore, the above-mentioned situation when a voltage of the input signal pair Sin reaches the predetermined level Vp can be regarded as when the difference in voltage between the first output signal Sfo+ and the second output signal Sfo− is larger than zero. Thus, the offset voltage Vf is a barrier to block the noise from erroneously activating the CDR circuit or the receiver, and those input signals having a difference in voltage (or amplitude) larger than the offset voltage Vf can only be regarded as the real input data. In this way, the high speed signal detection circuit 100 efficiently and precisely detects the real input data signal; noise signal whose amplitude is not larger than the offset voltage Vf will not activate the receiver.

In other words, if the offset generating circuit 102 is not employed to provide the offset voltage Vf for the input signal pair Sin, the sampling circuit 104 may directly receive the input signal pair Sin. Then, when the difference in voltage between the first input signal Sin+ and the second input signal Sin− is larger than zero, the sampling circuit 104 may sample the wrong input signal and accordingly generate the wrong sampling signal since the difference in voltage that is larger than zero may be merely induced by noise on the input signal pair Sin.

Please refer to FIG. 1 again in conjunction with FIG. 2. The clock signal Sck controls the sampling circuit 104 to sample the offset output signal pair Sfo in every cycle (or every half cycle) of the clock signal Sck. In this embodiment, the voltage level of the sampling signal Ss is transited to the high voltage level from the low voltage level when the sampling circuit 104 detects that the difference in voltage between the first output signal Sfo+ and the second output signal Sfo− is larger than zero at the time t3. The voltage level of the sampling signal Ss is transited to the low voltage level from the high voltage level when the sampling circuit 104 detects that the difference in voltage between the first output signal Sfo+ and the second output signal Sfo− is smaller than zero at the time t4. In other words, the voltage level of the sampling signal Ss is the high voltage level when the input data is bit one, and the voltage level of the sampling signal Ss is the low voltage level when the input data is bit zero. Accordingly, the sampling signal Ss is a toggle signal that transits between the high voltage level and the low voltage level when the real data is inputted into the detecting circuit 100. In other words, it is determined that the real data is inputted into the detecting circuit 100 if the sampling signal Ss is a toggle signal.

Since the sampling signal Ss may be used to awake the receiving system under the sleep mode as recited in the related art, the toggling sampling signal Ss is better to be stable at one voltage level, e.g., the high voltage level, when the real data is inputted into the detecting circuit 100 such that the receiving system may receive a stable wakening signal. Therefore, the extension circuit 106 is employed to receive the sampling signal Ss for holding the high voltage level, i.e., the above-mentioned second signal level V2, of the sampling signal Ss when the sampling signal Ss is transited from the low voltage level, i.e., the above-mentioned first signal level V1, to the high voltage level. For the example shown in FIG. 2, the extension circuit 106 holds the high voltage level at the time t4 and at the time t6. More specifically, at the time t4, the extension circuit 106 holds the high voltage level for one cycle of the clock signal Sck, and then the sampling signal Ss is transited from the low voltage level to the high voltage level again since the sampling circuit 104 samples the input signal pair of bit one at time t5. At the time t6, the extension circuit 106 holds the high voltage level for two cycles (e.g., the time interval ta) of the clock signal Sck until time t7. At time t7, the sampling circuit 104 detects that the difference in voltage between the first output signal Sfo+ and the second output signal Sfo− is substantially equal to the offset voltage Vf, and then the sampling circuit 104 determines that there is no real input data inputted into the detecting circuit 100. Then, the extension circuit 106 changes the voltage level of the detection signal Sd to transit back to the low voltage level from the high voltage level after time t7. Accordingly, the detection signal Sd, which is derived from the sampling signal Ss, has a stable high voltage level to awake the receiving system from the sleep mode.

Figure 3:
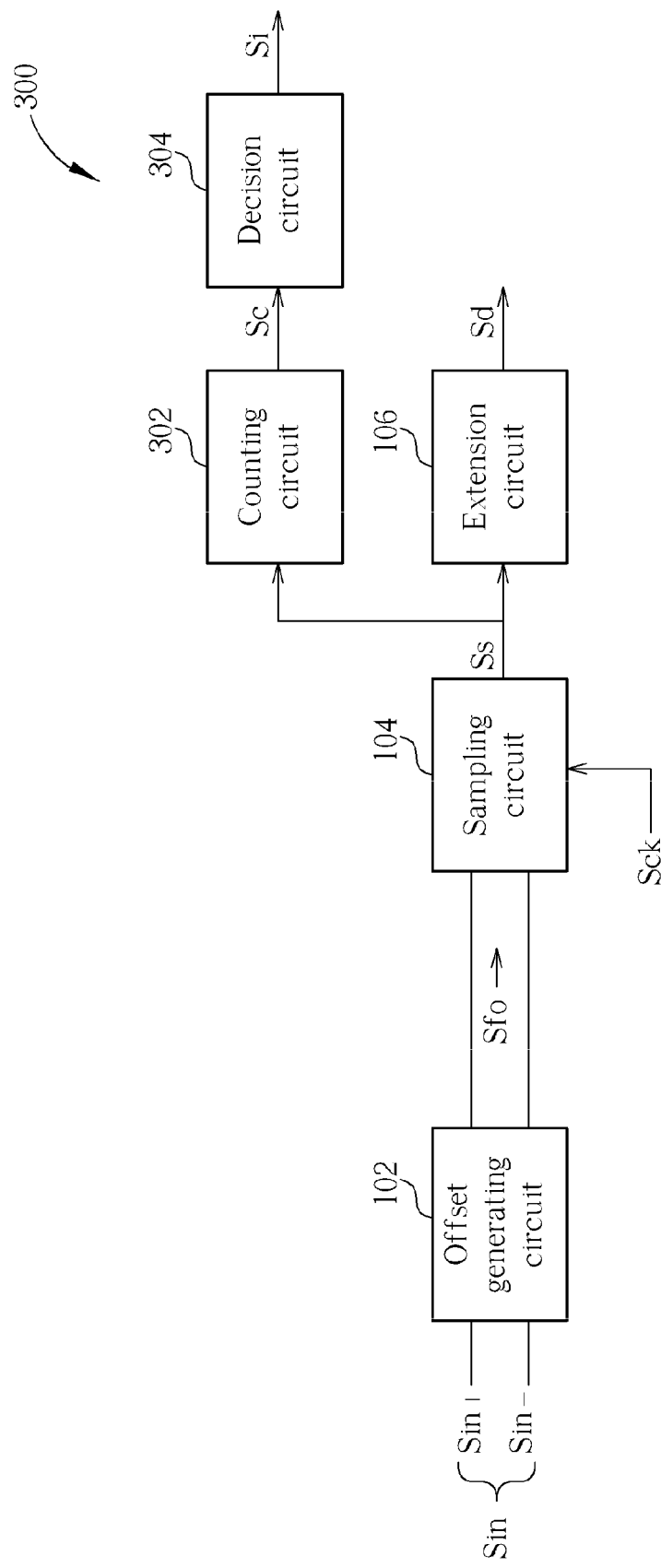
FIG. 3 is a diagram illustrating a detecting circuit according to a second embodiment of the present invention.

In addition, if the noise is large enough to make the difference in voltage between the first output signal Sfo+ and the second output signal Sfo− be larger than zero, the sampling circuit 104 may erroneously transit the voltage level of the sampling signal Ss from the low voltage level to the high voltage level. Then, the detecting circuit 100 may generate the detection signal Sd to erroneously awaken the receiving system from the sleep mode. A second embodiment is provided to solve this problem as shown in FIG. 3. FIG. 3 is a diagram illustrating a detecting circuit 300 according to a second embodiment of the present invention. As well as the offset generating circuit 102, the sampling circuit 104, and the extension circuit 106, the detecting circuit 300 further comprises a counting circuit 302 and a decision circuit 304. The counting circuit 302 is coupled to the sampling circuit 104 for counting the transitions in the sampling signal Ss to generate a counting value Sc. The decision circuit 304 is coupled to the counting circuit 302 to generate an indicating signal Si according to the counting value Sc. When the counting value Sc reaches a predetermined value, the decision circuit 304 generates the indicating signal Si to indicate that the detection signal Sd is a valid detection signal. It should be noted that the devices having the same numerals as the devices of the detecting circuit 100 also have similar functions, and thus their detailed description is omitted here for brevity.

More specifically, when the sampling circuit 104 generates the sampling signal Ss having transitions between the low voltage level and the high voltage level as shown in the time interval between the times t3 and t7, the counting circuit 302 counts the transitions (i.e., the edges) of the sampling signal Ss for generating the counting value Sc to determine if the transition is caused by noise or the real input data. Therefore, when the counting value Sc reaches the predetermined value (e.g., 10), the decision circuit 304 generates the indicating signal Si to indicate that the detection signal Sd is a valid detection signal, i.e., the transitions are caused by the real input data. When the counting value Sc does not reach the predetermined value, the decision circuit 304 generates the indicating signal Si to indicate that the detection signal Sd is not a valid detection signal, i.e., the transition is caused by noise. Accordingly, by using both the indicating signal Si and the detection signal Sd, the receiving system is guaranteed to be awoken by the real input data.

Furthermore, the sampling circuit 104 can be implemented as a D type flip-flop or a sense amplifier-based flip flop in other embodiments of the present invention, but this is not the limitation of the present invention.

Figure 4:
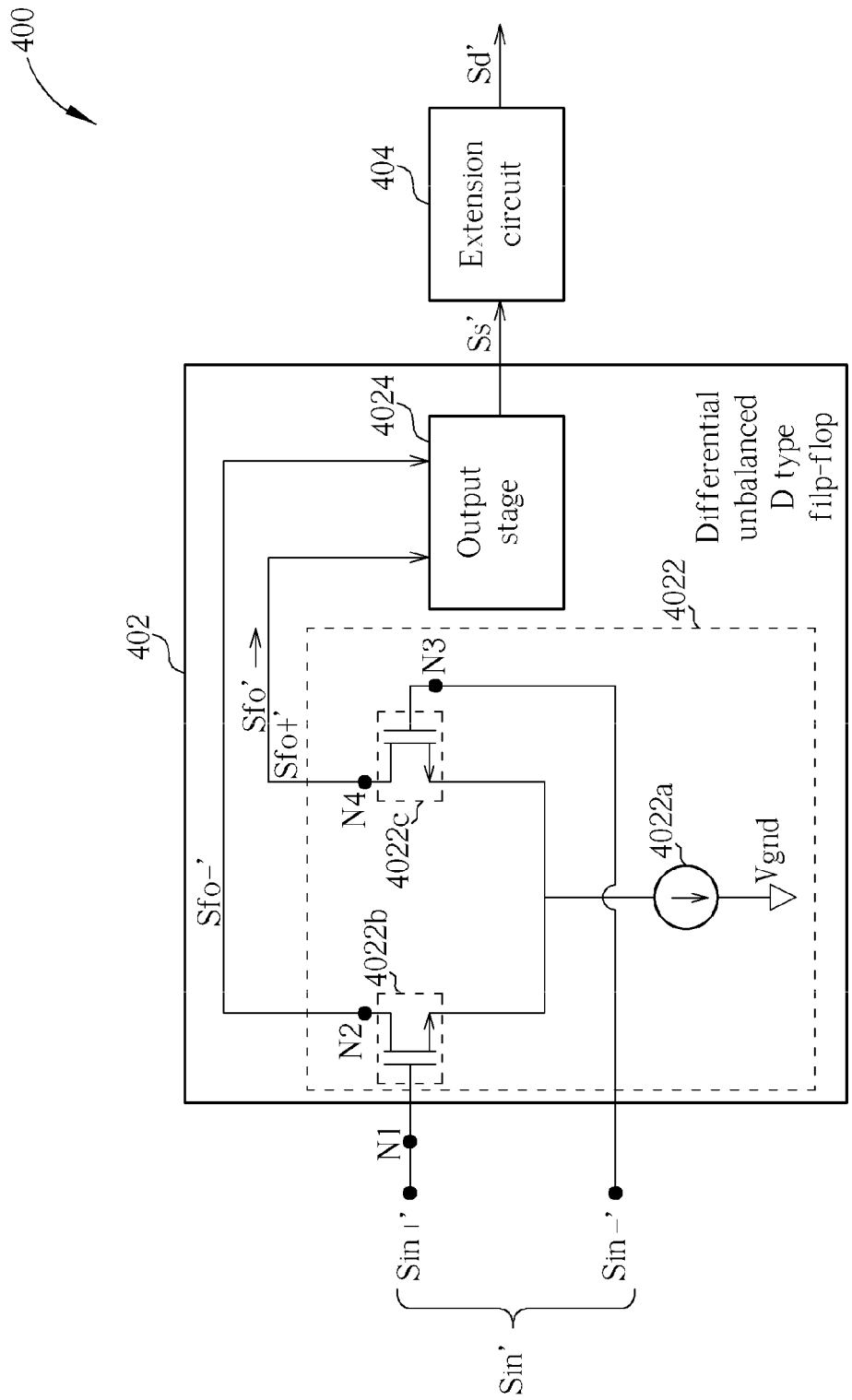
FIG. 4 is a diagram illustrating a detecting circuit according to a third embodiment of the present invention.

Please refer to FIG. 4. FIG. 4 is a diagram illustrating a detecting circuit 400 according to a third embodiment of the present invention. In this embodiment, the above-mentioned offset generating circuit 102 and the sampling circuit 104 are implemented by a differential unbalanced D type flip-flop. Therefore, the detecting circuit 400 comprises a differential unbalanced D type flip-flop 402 and an extension circuit 404. The input stage 4022 of the differential unbalanced D type flip-flop 402 is arranged to provide an offset voltage Vf' to the input signal pair Sin' to accordingly generate an offset output signal pair Sfo', and the output stage 4024 of the differential unbalanced D type flip-flop 402 is arranged to generate the sampling signal Ss' according to the offset output signal pair Sfo'. It should be noted that the input stage 4022 is only the differential input pair of the differential unbalanced D type flip-flop 402 but not the whole circuit of the differential unbalanced D type flip-flop 402, and the detailed circuit of the output stage 4024 of the differential unbalanced D type flip-flop 402 is omitted in FIG. 4 for brevity.

Similarly, the input signal pair Sin' is a differential input signal pair including a first input signal Sin+' and a second input signal Sin−', and the offset output signal pair Sfo' is a differential output signal pair including a first output signal Sfo−' and a second output signal Sfo+'. The offset generating circuit 4022 comprises a current source 4022a, a first transistor 4022b, and a second transistor 4022c. The current source 4022a has a first node coupled to a reference voltage, i.e., the ground voltage Vgnd. The first transistor 4022b, e.g., an N-type transistor, has a first node coupled to a second node of the current source 4022a, a control node N1 coupled to the first input signal Sin+', and a second node N2 outputting the first output signal Sfo−'. The second transistor 4022c, e.g., an N-type transistor, has a first node coupled to the second node of the current source 4022a, a control node N3 coupled to a second input signal Sin−', and a second node N4 outputting the second output signal Sfo+'. In addition, the aspect ratio $(W/L)_1$ of the first transistor 4022b is different from the aspect ratio $(W/L)_2$ of the second transistor 4022c. In this embodiment, the aspect ratio $(W/L)_1$ is smaller than the aspect ratio $(W/L)_2$. By doing this, the common mode voltage of the second output signal Sfo+' is reduced and the common mode voltage of the first output signal Sfo−' is kept intact, or the common mode voltage of the first output signal Sfo−' is increased and the common mode voltage of the second output signal Sfo+' is kept intact. In other words, by adjusting the aspect ratio $(W/L)_1$ and the aspect ratio $(W/L)_2$, the offset voltage Vf is provided to adjust the common mode voltage of the first input signal Sin+' or the common mode voltage of the second input signal Sin−' to accordingly generate the first output signal Sfo+' and the second output signal Sfo−'.

When the first output signal Sfo+' and the second output signal Sfo−' are generated, the output stage 4024 receives the first output signal Sfo+' and the second output signal Sfo−' to generate the sampling signal Ss' accordingly. Since the rest operation of the detecting circuit 400 is similar to the first embodiment detecting circuit 100, the detailed description is omitted here for brevity. It should be noted that, by utilizing the differential unbalanced D type flip-flop 402 to implement the offset generating circuit 102 and the sampling circuit 104, the size of the detecting circuit 400 can be minimized. Furthermore, the offset generating circuit 102 and the sampling circuit 104 can also be implemented by merely a sensing amplifier having an unbalanced differential input pair similar to the input stage 4022 of the differential unbalanced D type flip-flop 402, which also belongs to the scope of the present invention. In addition, the embodiment disclosed in FIG. 3 can also be applied in the embodiment of FIG. 4 to reach similar results, and this also belongs to the scope of the present invention.

Figure 5:
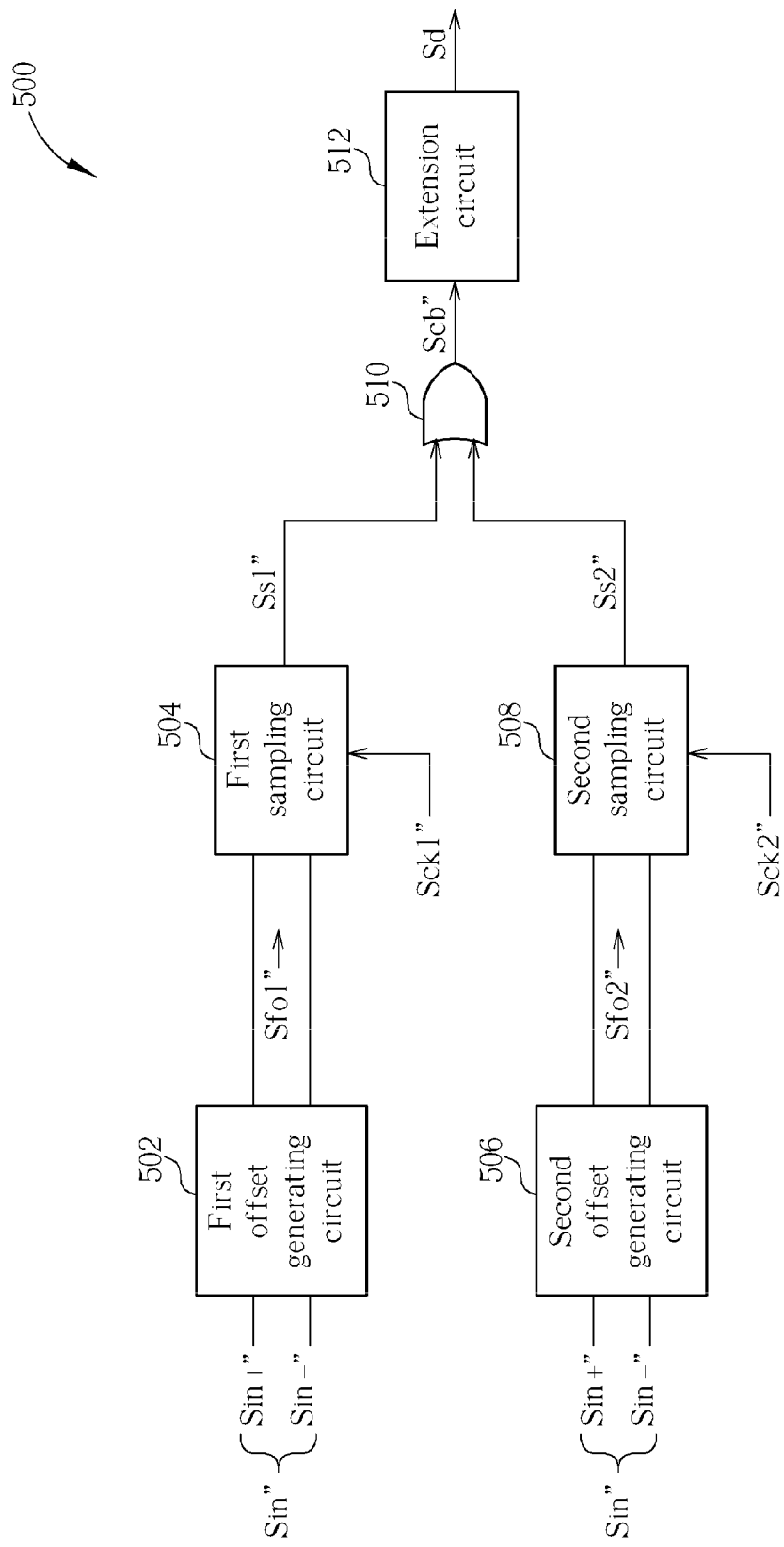
FIG. 5 is a diagram illustrating a detecting circuit according to a fourth embodiment of the present invention.

Please refer to FIG. 2 again. If the sampling edges of the clock signal Sck are aligned to the transition edges of the offset output signal pair Sfo, the sampling circuit 104 may be unable to distinguish if the sampled point upon the offset output signal pair Sfo corresponds to bit one or bit zero. In this case, the sampling circuit 104 may generate the wrong sampling signal Ss to the extension circuit 106. Therefore, another embodiment is presented to solve this problem as shown in FIG. 5. FIG. 5 is a diagram illustrating a detecting circuit 500 according to a fourth embodiment of the present invention. The detecting circuit 500 comprises a first offset generating circuit 502, a first sampling circuit 504, a second offset generating circuit 506, a second sampling circuit 508, a logic circuit 510, and an extension circuit 512. The first offset generating circuit 502 is arranged to apply a first offset Vf1" to an input signal pair Sin" and accordingly generate a first offset output signal pair Sfo1". The first sampling circuit 504 is coupled to the first offset generating circuit 502 to sample the first offset output signal pair Sfo1" for generating a first sampling signal Ss1" when a voltage difference between the first offset output signal pair Sfo1" reaches a first predetermined level Vp1" according to a first clock signal Sck1". The second offset generating circuit 506 is arranged to apply a second offset Vf2" to the input signal pair Sin" and accordingly generate a second offset output signal pair Sfo2". The second sampling circuit 508 is coupled to the second offset generating circuit 506 to sample the second offset output signal pair Sfo2" for generating a second sampling signal Ss2" according to a second clock signal Sck2" when a voltage difference between the second offset output signal pair Sfo2" reaches a second predetermined level Vp2". The logic circuit 510 is coupled to the first sampling circuit 504 and the second sampling circuit 508 for combining the first sampling signal Ss1" and the second sampling signal Ss2" to generate a combined sampling signal Scb" for identifying a data signal on the input signal pair Sin". In addition, the combined sampling signal Scb" has transitions between a first signal level V1" and a second signal level V2" The extension circuit 512 is coupled to the logic circuit 510 to hold the second signal level V2" of the combined sampling signal Scb" during at least one specific duration and accordingly generate the detection signal Sd", wherein the combined sampling signal Scb" has one transition from the first signal level V1" to the second signal level V2" in the beginning of each specific duration. Furthermore, the obtained detection signal Sd" is utilized to identify if a real signal is transmitted to a receiver.

Please note that the first offset generating circuit 502 and the second offset generating circuit 506 are operated in a similar way to the operation of the above-mentioned offset generating circuit 502, the first sampling circuit 504 and the second sampling circuit 508 are operated in a similar way to the operation of the above-mentioned sampling circuit 104, and the extension circuit 512 is operated in a similar way to the operation of the above-mentioned extension circuit 106, thus detailed descriptions are omitted here for brevity. Furthermore, the first offset Vf1" is equal to the second offset Vf2", and the first predetermined level Vp1" is equal to the second predetermined level Vp2" in this embodiment, however this is not the limitation of the present invention.

Figure 6:
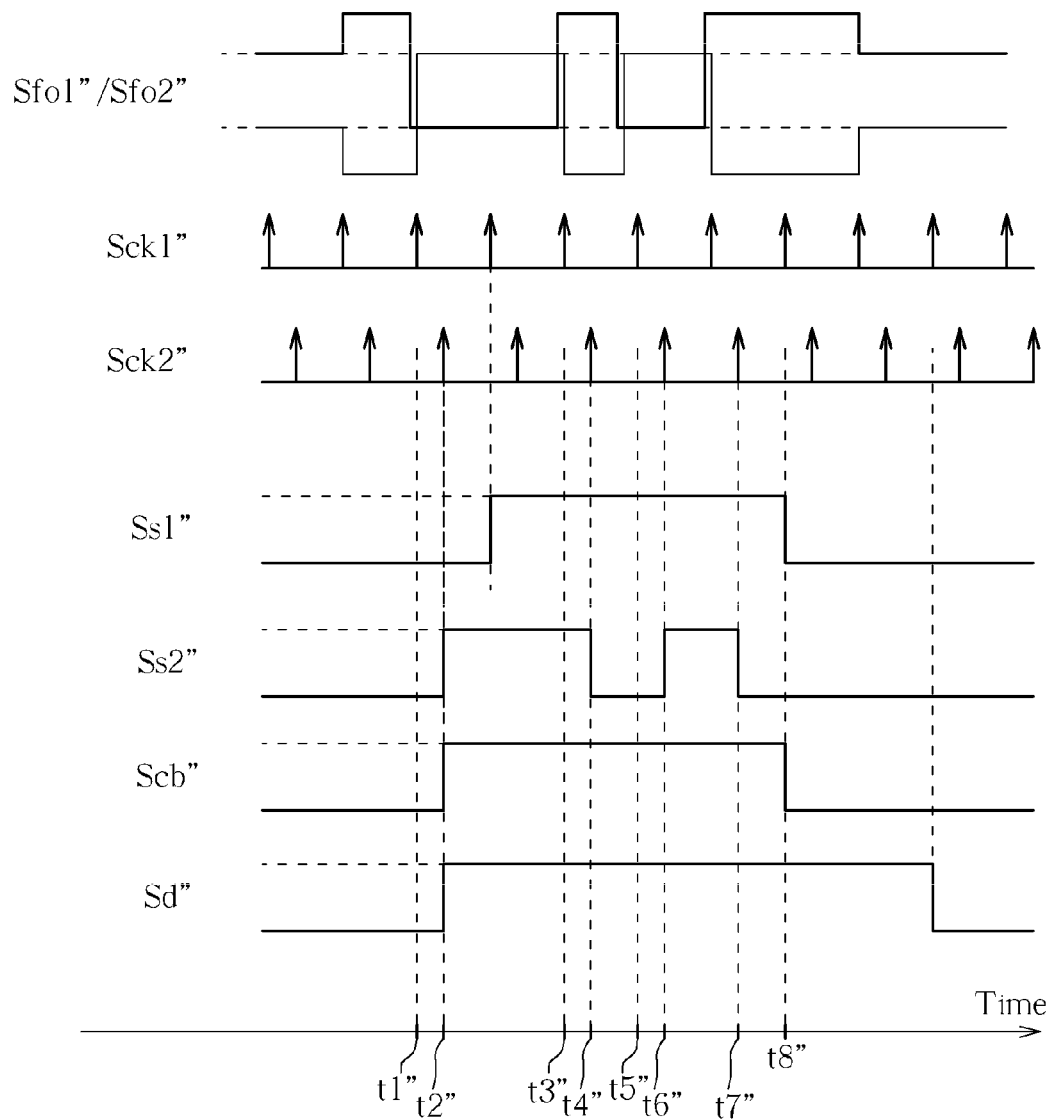
FIG. 6 is a timing diagram illustrating a first offset output signal pair, a second offset output signal pair, a first clock signal, a second clock signal, a first sampling signal, a second sampling signal, a combined sampling signal, and a detection signal in the detecting circuit in FIG. 5.

In this embodiment, the phase of the first clock signal Sck1" is different from the phase of the second clock signal Sck2". Therefore, the sampling time of the first sampling circuit 504 sampling the first offset output signal pair Sfo1" is different from the sampling time of the second sampling circuit 508 sampling the second offset output signal pair Sfo2". To more clearly illustrate the operation of the first sampling circuit 504 and the second sampling circuit 508, the first offset output signal pair Sfo1" is assumed to be similar to the second offset output signal pair Sfo2" as shown in FIG. 6. FIG. 6 is a timing diagram illustrating the first offset output signal pair Sfo1", the second offset output signal pair Sfo2", the first clock signal Sck1", the second clock signal Sck2", the first sampling signal Ss1", the second sampling signal Ss2", the combined sampling signal Scb", and the detection signal Sd" according to an embodiment of the present invention, wherein the sampling edges of the first clock signal Sck1" are assumed to align to the transition edges of the first offset output signal pair Sfo1", and the sampling edges of the second clock signal Sck2" are slightly staggered from the transition edges of the second offset output signal pair Sfo2".

Accordingly, the first sampling circuit 504 may not transit the voltage level of the first sampling signal Ss1" to the high voltage level from the low voltage level at time t1" and time t5" since the first sampling circuit 504 samples the transition edge of the first offset output signal pair Sfo1". However, the second sampling circuit 508 transits the voltage level of the second sampling signal Ss2" to the high voltage level from the low voltage level at time t2" and time t6" since the first sampling circuit 504 does not sample the transition edge of the second offset output signal pair Sfo2". Similarly, the first sampling circuit 504 may not transit the voltage level of the first sampling signal Ss1" back to the low voltage level from the high voltage level at time t3" but transit the voltage level of the first sampling signal Ss1" to the low voltage level from the high voltage level at time t8" instead. However, the second sampling circuit 508 transits the voltage level of the second sampling signal Ss2" back to the low voltage level from the high voltage level at time t4" and time t7".

The logic circuit 510, which may be implemented by an OR gate, combines the first sampling signal Ss1" and the second sampling signal Ss2" to generate the combined sampling signal Scb". In other words, if the clock signal of one sampling circuit of the first sampling circuit 504 and the second sampling circuit 508 is aligned to the transition edges of offset output signal pair, e.g., the first offset output signal pair Sfo1" and the second offset output signal pair Sfo2" in this embodiment, the other sampling circuit can still sample the offset output signal pair correctly to generate the corresponding sampling signal.

In addition, the first offset generating circuit 502 and the second offset generating circuit 506 can also be merged into one offset generating circuit since the first offset output signal pair Sfo1" is similar to the second offset output signal pair Sfo2" in this embodiment. More specifically, the only offset generating circuit provides an offset to the input signal pair Sin" and accordingly generates an offset output signal pair for both the first sampling circuit 504 and the second sampling circuit 508. Furthermore, the embodiment disclosed in FIG. 4 can also be applied in the embodiment of FIG. 5 in order to reach similar results, and this also belongs to the scope of the present invention.

Furthermore, the embodiment disclosed in FIG. 3 can also be applied in the embodiment of FIG. 5 in order to reach similar results. More specifically, a counting circuit can be employed to couple to the logic circuit 512 for counting the transitions of the combined sampling signal Scb" to generate a counting value Sc". A decision circuit can be employed to couple to the counting circuit to generate an indicating signal Si" according to the counting value Sc", wherein when the counting value Sc" reaches a predetermined value, the decision circuit generates the indicating signal Si" to indicate that the detection signal Sd" is a valid detection signal. As the operation of the counting circuit and the decision circuit is similar to the above-mentioned counting circuit 302 and the decision circuit 304, the detailed description is omitted here for brevity.

Figure 7:
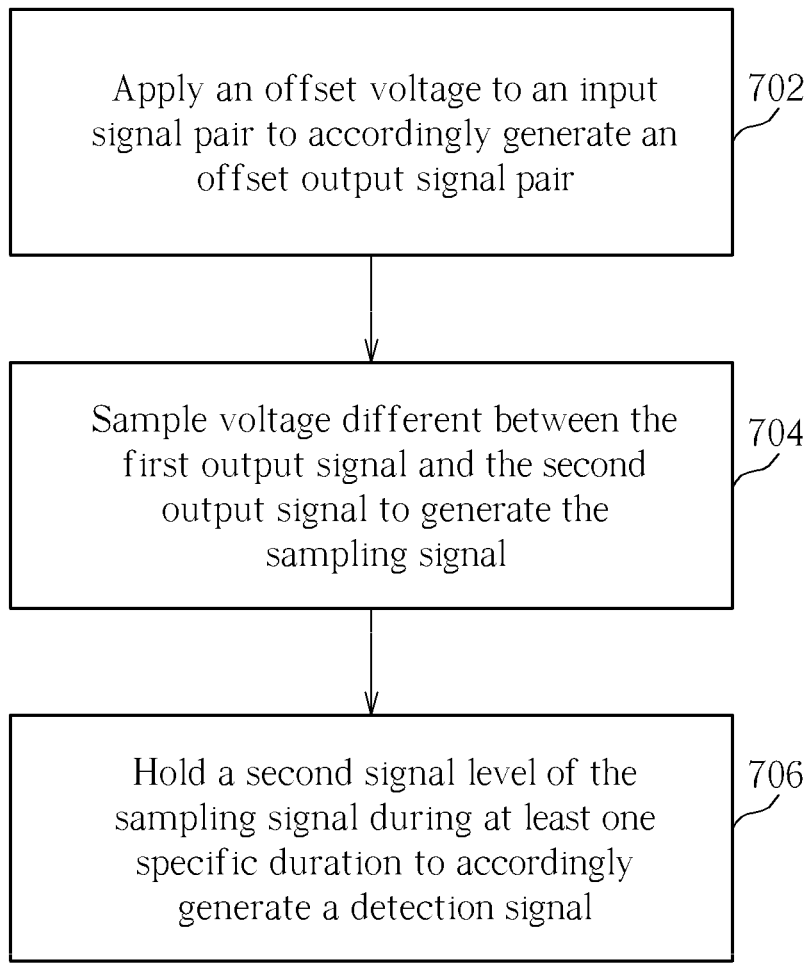
FIG. 7 is a flowchart illustrating a detecting method according to a fifth embodiment of the present invention.

Please refer to FIG. 7. FIG. 7 is a flowchart illustrating a detecting method 700 according to an embodiment of the present invention. The detecting method 700 is for generating a detection signal to awake the receiving system from the sleep mode. Therefore, the above-mentioned embodiments of detecting circuit may be regarded as employing the detecting method 700 to generate the detection signal. For simplicity, the detailed description of the detecting method 700 is described in conjunction with the detecting circuit 100. Furthermore, provided that substantially the same result is achieved, the steps of the flowchart shown in FIG. 7 need not be in the exact order shown and need not be contiguous; that is, other steps can be intermediate. The detecting method 700 comprises:

Step 702: Apply the offset voltage Vf to the input signal pair Sin to accordingly generate the offset output signal pair Sfo;

Step 704: Sample a voltage difference between the first output signal Sfo+ and the second output signal Sfo− to generate the sampling signal Ss for identifying if a real input data signal is on the input signal pair;

Step 706: Hold the second signal level V2 of the sampling signal Ss during at least one specific duration to accordingly generate the detection signal Sd.

Since the detecting method 700 is applied in the differential detecting circuit 100, the offset voltage Vf can be applied in either the first input signal Sin+ or the second input signal Sin− of the differential pair input signal Sin for adjusting the common mode voltage of the input signal pair being applied. For example, the offset voltage Vf is applied to the first input signal Sin+ to reduce the common mode voltage of the first input signal Sin+ to accordingly generate the first output signal Sfo+ and keep the second input signal Sin− intact to accordingly generate the second output signal Sfo−.

According to the embodiment of the detecting circuit 100 as described above, the difference in voltage between the first input signal Sin+ and the second input signal Sin− is larger than zero if the input data is bit one, and the difference in voltage between the first input signal Sin+ and the second input signal Sin− is smaller than zero if the input data is bit zero. Therefore, when the difference in voltage between the first input signal Sin+ and the second input signal Sin− is larger than zero, the sampling circuit 104 transits the voltage level of the sampling signal Ss to the high voltage level from the low voltage level, and when the difference in voltage between the first input signal Sin+ and the second input signal Sin− is smaller than zero, the sampling circuit 104 transits the voltage level of the sampling signal Ss back to the low voltage level from the high voltage level (Step 704).

Accordingly, the sampling signal Ss is a toggle signal that transits between the high voltage level and the low voltage level when the real data is inputted into the detecting circuit 100. Then, the extension circuit 106 holds the high voltage level of the sampling signal Ss until there is no real data to be inputted into the detecting circuit 100 (Step 706). Accordingly, the detection signal Sd having the stable high voltage level can be generated to awake the receiving system from the sleep mode.

Briefly, by providing an offset voltage upon the input signal, the present invention provides efficient detecting circuits to accurately detect if a real differential input data is inputted to the receiving system. In addition, by implementing the detecting circuits in a digital way, the size of the detecting circuits can be minimized and the operating speed of the detecting circuits can be maximized.

Those skilled in the art will readily observe that numerous modifications and alterations of the device and method may be made while retaining the teachings of the invention.

What is claimed is:
1. A detecting circuit, comprising:
a first offset generating circuit, arranged to apply a first offset to an input signal pair comprising a positive input signal and a negative input signal and accordingly generate a first output signal pair comprising a first positive output signal and a first negative output signal; and
a first sampling circuit, coupled to the first offset generating circuit, the first sampling circuit arranged to sample a difference in voltage between the first positive output signal and the first negative output signal to generate a first sampling signal, wherein the first sampling signal is utilized to identify a data signal on the input signal pair, and the first sampling circuit is controlled by a first periodical clock signal.

2. The detecting circuit of claim 1, wherein the first offset generating circuit applies the first offset to the input signal pair in order to provide different common mode voltages to the first positive output signal and the first negative output signal.

3. The detecting circuit of claim 2, wherein the common mode voltage of the first positive output signal is the common mode voltage of the first negative output signal minus the first offset, and the first sampling signal is utilized to identify the data signal with amplitude larger than the first offset.

4. The detecting circuit of claim 1, wherein the first sampling circuit comprises a D type flip-flop or a sense amplifier-based flip flop.

5. The detecting circuit of claim 1, wherein the first offset generating circuit comprises:
- a current source, having a first node coupled to a reference voltage;
- a first transistor, having a first node coupled to a second node of the current source, a control node coupled to the positive input signal included in the input signal pair, and a second node outputting the first negative output signal; and
- a second transistor, having a first node coupled to the second node of the current source, a control node coupled to the negative input signal included in the input signal pair, and a second node outputting the first positive output signal;
- wherein an aspect ratio of the first transistor is different from an aspect ratio of the second transistor.

6. A detecting method, comprising:
- applying, with an offset generating circuit, a first offset to an input signal pair comprising a positive input signal and a negative input signal to accordingly generate a first output signal pair comprising a first positive output signal and a first negative output signal; and
- sampling, with a sampling circuit, a difference in voltage between the first positive output signal and the first negative output signal to generate a first sampling signal, wherein the first sampling signal is utilized to identify a data signal on the input signal pair, and the sampling circuit is controlled by a periodical clock signal.

7. The detecting method of claim 6, wherein the step of applying the first offset to the input signal pair comprising the positive input signal and the negative input signal to accordingly generate the first output signal pair comprising the first positive output signal and the first negative output signal comprises:
- applying the first offset to the input signal pair in order to provide different common mode voltages to the first positive output signal and the first negative output signal.

8. The detecting method of claim 7, wherein the common mode voltage of the first positive output signal is the common mode voltage of the first negative output signal minus the first offset, and the first sampling signal is utilized to identify the data signal with amplitude larger than the first offset.

9. A detecting method, comprising:
- applying, with an offset generating circuit, an offset to an input signal pair to accordingly generate an offset output signal pair; and
- sampling, with a sampling circuit, the offset output signal pair for generating a sampling signal when a difference in voltage between the first offset output signal pair reaches a predetermined level, wherein the sampling signal is utilized to identify a data signal on the input signal pair, and the sampling circuit is controlled by a periodical clock signal.

10. A detecting circuit, comprising:
- a first offset generating circuit, arranged to apply a first offset to an input signal pair comprising a positive input signal and a negative input signal and accordingly generate a first output signal pair comprising a first positive output signal and a first negative output signal;
- a first sampling circuit, coupled to the first offset generating circuit, the first sampling circuit arranged to sample a difference in voltage between the first positive output signal and the first negative output signal to generate a first sampling signal, wherein the first sampling signal is utilized to identify a data signal on the input signal pair;
- a counting circuit, coupled to the first sampling circuit, the counting circuit arranged to count transitions in the first sampling signal to generate a counting value; and
- a decision circuit, coupled to the counting circuit, the decision circuit arranged to generate an indicating signal according to the counting value;
- wherein when the counting value reaches a predetermined value, the decision circuit generates the indicating signal to indicate that the first sampling signal is a valid first sampling signal.

11. A detecting circuit, comprising:
- a first offset generating circuit, arranged to apply a first offset to an input signal pair comprising a positive input signal and a negative input signal and accordingly generate a first output signal pair comprising a first positive output signal and a first negative output signal;
- a first sampling circuit, coupled to the first offset generating circuit, the first sampling circuit arranged to sample a difference in voltage between the first positive output signal and the first negative output signal to generate a first sampling signal, wherein the first sampling signal is utilized to identify a data signal on the input signal pair, and the first sampling signal has transitions between a first signal level and a second signal level; and
- an extension circuit, coupled to the first sampling circuit, the extension circuit arranged to hold the second signal level of the first sampling signal during at least one specific duration and accordingly generate a detection signal utilized to identify the data signal on the input signal pair.

12. A detecting circuit, comprising:
- a first offset generating circuit, arranged to apply a first offset to an input signal pair comprising a positive input signal and a negative input signal and accordingly generate a first output signal pair comprising a first positive output signal and a first negative output signal;
- a first sampling circuit, coupled to the first offset generating circuit, the first sampling circuit arranged to sample a difference in voltage between the first positive output signal and the first negative output signal to generate a first sampling signal, wherein the first sampling signal is utilized to identify a data signal on the input signal pair, and the first sampling circuit is controlled by a first clock signal;
- a second offset generating circuit, arranged to apply a second offset to the input signal pair and accordingly generate a second offset output signal pair comprising a second positive output signal and a second negative output signal;
- a second sampling circuit, coupled to the second offset generating circuit, the second sampling circuit arranged to sample a difference in voltage between the second positive output signal and the second negative output signal according to a second clock signal to generate a second sampling signal; and a logic circuit, coupled to the first sampling circuit and the second sampling circuit, for combining the first sampling signal and the second sampling signal to generate a combined sampling signal;

wherein the combined sampling signal is utilized to identify the data signal on the input signal pair, and a phase of the first clock signal is different from a phase of the second clock signal.

13. The detecting circuit of claim 12, wherein the combined sampling signal has transitions between a first signal level and a second signal level, and the detecting circuit further comprises:

an extension circuit, coupled to the logic circuit, the extension circuit arranged to hold the second signal level of the combined sampling signal during at least one specific duration and accordingly generate a detection signal utilized to identify the data signal on the input signal pair.

14. The detecting circuit of claim 12, wherein the first offset substantially equals the second offset.

15. The detecting circuit of claim 12, further comprising:
a counting circuit, coupled to the logic circuit, the counting circuit arranged to count transitions of the combined sampling signal to generate a counting value; and
a decision circuit, coupled to the counting circuit, the decision circuit arranged to generate an indicating signal according to the counting value;
wherein when the counting value reaches a predetermined value, the decision circuit generates the indicating signal to indicate that the combined sampling signal is a valid combined sampling signal.

16. A detecting method, comprising:
applying, with an offset generating circuit, a first offset to an input signal pair comprising a positive input signal and a negative input signal to accordingly generate a first output signal pair comprising a first positive output signal and a first negative output signal;
sampling, with a sampling circuit a difference in voltage between the first positive output signal and the first negative output signal to generate a first sampling signal, wherein the first sampling signal is utilized to identify a data signal on the input signal pair;
counting transitions in the first sampling signal to generate a counting value;
generating an indicating signal according to the counting value; and
utilizing the indicating signal to indicate that the first sampling signal is a valid first sampling signal when the counting value reaches a predetermined value.

17. A detecting method, comprising:
applying, with an offset generating circuit, a first offset to an input signal pair comprising a positive input signal and a negative input signal to accordingly generate a first output signal pair comprising a first positive output signal and a first negative output signal;

sampling, with a sampling circuit a difference in voltage between the first positive output signal and the first negative output signal to generate a first sampling signal, wherein the first sampling signal is utilized to identify a data signal on the input signal pair, and the first sampling signal has transitions between a first signal level and a second signal level; and holding the second signal level of the first sampling signal during at least one specific duration to accordingly generate a detection signal utilized to identify the data signal on the input signal pair.

18. A detecting method, comprising:
applying, with an offset generating circuit, a first offset to an input signal pair comprising a positive input signal and a negative input signal to accordingly generate a first output signal pair comprising a first positive output signal and a first negative output signal;
sampling, with a sampling circuit a difference in voltage between the first positive output signal and the first negative output signal to generate a first sampling signal, wherein the first sampling signal is utilized to identify a data signal on the input signal pair, and the step of sampling the difference in voltage between the first positive output signal and the first negative output signal to generate the first sampling signal is controlled by a first clock signal;
applying a second offset to the input signal pair to accordingly generate a second offset output signal pair comprising a second positive output signal and a second negative output signal;
sampling a difference in voltage between the second positive output signal and the second negative output signal according to a second clock signal to generate a second sampling signal; and
combining the first sampling signal and the second sampling signal to generate a combined sampling signal;
wherein the combined sampling signal is utilized to identify the data signal on the input signal pair, and a phase of the first clock signal is different from a phase of the second clock signal.

19. The detecting method of claim 18, wherein the combined sampling signal has transitions between a first signal level and a second signal level, and the detecting method further comprises:
holding the second signal level of the combined sampling signal during at least one specific duration to accordingly generate a detection signal utilized to identify the data signal on the input signal pair.

20. The detecting method of claim 19, wherein the first offset substantially equals the second offset.

21. The detecting method of claim 19, further comprising:
counting transitions of the combined sampling signal to generate a counting value;
generating an indicating signal according to the counting value; and
utilizing the indicating signal to indicate that the combined sampling signal is a valid combined sampling signal when the counting value reaches a predetermined value.

* * * * *